(12) United States Patent
McLeod

(10) Patent No.: US 8,138,802 B2
(45) Date of Patent: Mar. 20, 2012

(54) SYMMETRICAL ELECTRICAL PHYSICAL LAYER ACTIVITY DETECTOR

(75) Inventor: Scott C. McLeod, Oro Valley, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 0 days.

(21) Appl. No.: 13/182,576

(22) Filed: Jul. 14, 2011

(65) Prior Publication Data

US 2011/0267110 A1 Nov. 3, 2011

Related U.S. Application Data

(62) Division of application No. 12/050,223, filed on Mar. 18, 2008, now Pat. No. 7,990,182.

(51) Int. Cl.
*H03K 5/153* (2006.01)
(52) U.S. Cl. ............................ 327/58; 327/62; 327/65
(58) Field of Classification Search .............. 327/58–62, 327/65–67, 563; 330/253, 258
See application file for complete search history.

(56) References Cited

U.S. PATENT DOCUMENTS

| | | |
|---|---|---|
| 4,893,091 A | 1/1990 | Lillis et al. |
| 5,650,750 A | 7/1997 | Leyde et al. |
| 6,194,965 B1 | 2/2001 | Kruczkowski et al. |
| 6,727,732 B1 | 4/2004 | Wu et al. |
| 6,781,465 B1 | 8/2004 | Berzins et al. |
| 7,061,279 B1 | 6/2006 | Leete |
| 7,113,754 B2 | 9/2006 | Chien |

(Continued)

FOREIGN PATENT DOCUMENTS

WO 9823027 5/1998

OTHER PUBLICATIONS

Seevinck, et al.; "Generalized Translinear Circuit Principle," IEEE Journal of Solid-State Circuits, vol. 26, No. 8, Aug. 1991, pp. 1098-1102.

(Continued)

*Primary Examiner* — Long Nguyen
(74) *Attorney, Agent, or Firm* — Meyertons Hood Kivlin Kowert & Goetzel, P.C.; Jeffrey C. Hood

(57) ABSTRACT

A low-current differential signal activity detector circuit may be configured to reject large common mode signals on differential input lines, while still detecting smaller differential signals applied to the same set of differential input lines. The detector circuit may comprise a translinear buffer that is driven at the buffer input and at the buffer output by the differential input signals. The differential signal thereby driving the inputs of the detector circuit may be half-wave rectified through the buffer output devices and may be filtered to provide the detected output. When applying a common mode signal, the buffer's input and output may track each other, and no current may be rectified in the output devices, thus providing common-mode signal rejection. The detector circuit may also be configured with two buffers having their outputs coupled to a common node, each buffer input driven by a respective one of the differential input signals. The differential signal thereby driving the inputs of the detector circuit may be fully rectified through the output devices of the two buffers, and may be filtered to provide the detected output. The two buffers may be configured in a symmetrical structure that allows for the rejection of common-mode signals when the outputs of the buffers are coupled to a common node.

6 Claims, 3 Drawing Sheets

U.S. PATENT DOCUMENTS

| | | |
|---|---|---|
| 7,161,877 B2 | 1/2007 | Lai et al. |
| 7,990,182 B2 * | 8/2011 | McLeod .......................... 327/58 |
| 2001/0038312 A1 | 11/2001 | Smith et al. |
| 2002/0094024 A1 | 7/2002 | Ma et al. |
| 2003/0001666 A1 * | 1/2003 | Watanabe et al. ............. 327/563 |
| 2003/0164720 A1 | 9/2003 | Self |
| 2005/0015687 A1 | 1/2005 | Lai et al. |
| 2005/0253629 A1 | 11/2005 | Zivanovic |
| 2006/0208768 A1 * | 9/2006 | Momtaz et al. ................. 327/58 |
| 2007/0180281 A1 * | 8/2007 | Partovi et al. ................. 713/320 |
| 2007/0188214 A1 | 8/2007 | Koyama et al. |
| 2009/0108880 A1 | 4/2009 | Soltanian |

OTHER PUBLICATIONS

"MOST: Media Oriented Systems Transport—MOST Specification Rev. 2.5," MOST Corporation, Oct. 2006, 242 pages.

"MOST: Media Oriented Systems Transport—MAMAC Specification Rev. 1.1"; MOST Corporation, Dec. 2003, 26 pages.

"MOST: Media Oriented Systems Transport—MOST Dynamic Specification Rev. 1.3," MOST Corporation; Dec. 2006, 137 pages.

International Search Report in Application No. PCT/US2009/037367 dated Jul. 10, 2009, 12 pages.

* cited by examiner

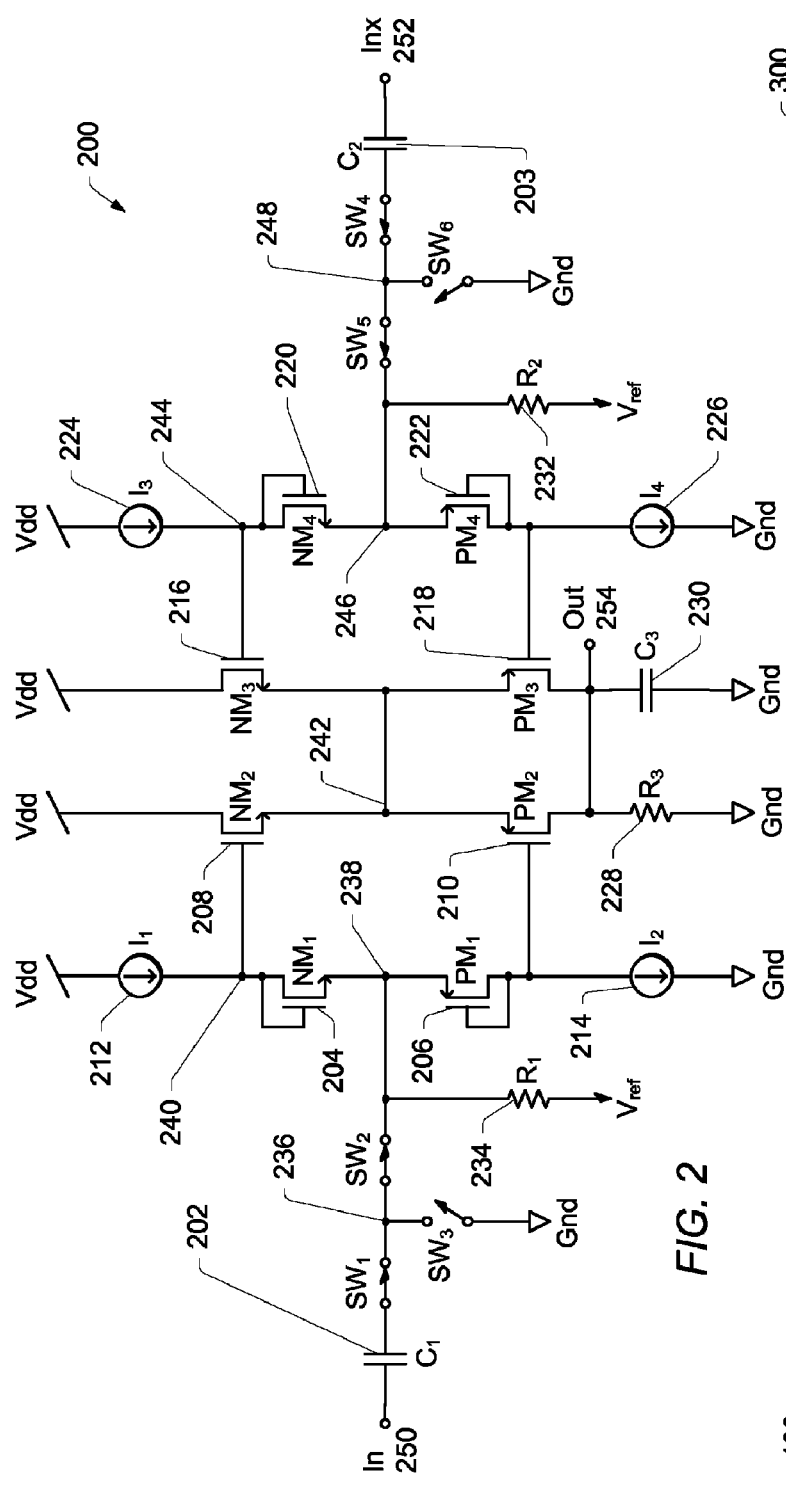
FIG. 2
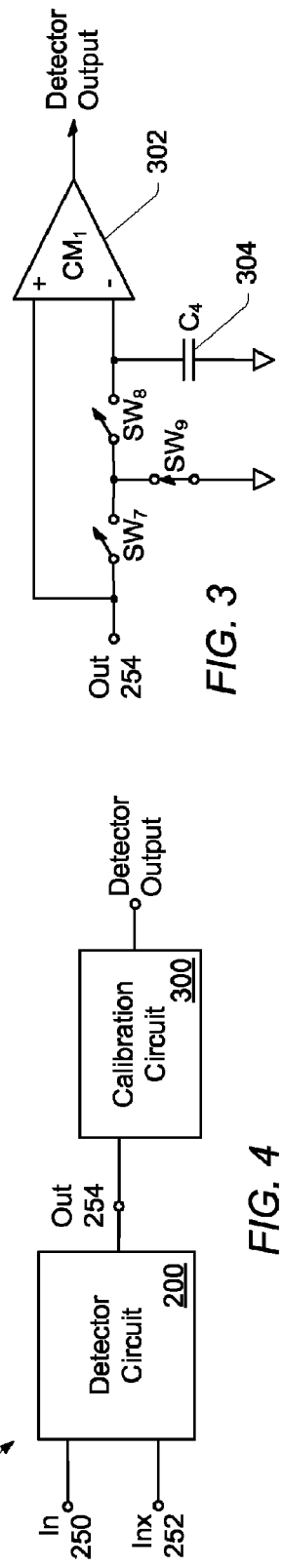
FIG. 3
FIG. 4

SYMMETRICAL ELECTRICAL PHYSICAL LAYER ACTIVITY DETECTOR

PRIORITY INFORMATION

This application is a divisional application of U.S. application Ser. No. 12/050,223 titled "Electrical Physical Layer Activity Detector" filed Mar. 18, 2008, now U.S. Pat. No. 7,990,182, whose inventor is Scott C. McLeod and which is hereby incorporated by reference in its entirety as though fully and completely set forth herein.

BACKGROUND OF THE INVENTION

1. Field of the Invention

This invention relates generally to analog circuit design, and, more particularly, to the design of a detector circuit that consumes low current and can reject large common mode signals while detecting small differential signal activity.

2. Description of the Related Art

Media Oriented Systems Transport (MOST) is a fiber optic network configured for the efficient transport of high volumes of data at low-cost. Due to its typically low-overhead and low-cost interface, MOST is often used for communicating with a wide variety of peripheral devices in the car environment, like microphones and speakers. Overall, MOST is a synchronous network, where a timing master supplies a clock signal with a synchronous and continuous data signal, with all other devices synchronizing their operation to this clock signal. This eliminates the need for buffering, and having to perform sample rate conversion, making it possible to interconnect simple and inexpensive devices, while minimizing the complexity and cost of the network interface hardware.

Much like in a public switched telephone network, MOST systems facilitate the transport of multiple streaming data channels and a control channel within the synchronous base data signal. The control channel is typically used for setting up streaming data channels between a sender and a receiver. Once the connection between the sender and the receiver has been established, data can flow continuously without requiring any further addressing or packet label information processing. Since the bandwidth of the streaming data channels is reserved for the dedicated stream (and available), there are no interruptions, collisions, or slow-down of the data stream transport. Thus, MOST is oftentimes the optimum mechanism for delivering streaming data, that is, continuously flowing information such as audiovisual content.

Computer based data—such as Internet traffic or information from a navigation system—can be relayed as packets transmitted in short (asynchronous) bursts to many different destinations. In order to accommodate such signals, MOST includes efficient mechanisms for the transmission of asynchronous, packet-based data, in addition to the control channel and streaming data channels. While typically running on top of the permanent synchronous data signal, these mechanisms remain completely separate from the control channel and streaming data channels, and don't interfere with each other.

The MOST specification consists of three main sections: the application section, the network section, and the hardware section, the latter comprising different possible physical layers. One possible physical layer is the Electrical Physical Layer (ePHY), which may comprise a twisted wire bus (i.e. a differential signal line). A MOST network may be activated (woken up) upon detecting activity on the ePHY signal line, which may be performed in a variety of ways. For example, some MOST environments may be configured with a diode, filter and comparator to perform the detection. Such a configuration, however, is not ideally suited for (if at all capable of) rejecting common mode signals, and consumes more than an ideal amount of current. Thus, such solutions do not lend themselves to rejecting large common mode signals on the differential (ePHY) lines while simultaneously detecting the desired differential signal indicating valid bus activity on the bus, to thereby wake up the given MOST node.

Other corresponding issues related to the prior art will become apparent to one skilled in the art after comparing such prior art with the present invention as described herein.

SUMMARY OF THE INVENTION

Various embodiments of a detector circuit that uses very low-current, also referred to as a low-current detector [circuit] may be operable to reject large common mode signals on a pair of differential input lines, for example MOST (Media Oriented Systems Transport) ePHY lines, and still detect the smaller differential communication signals. The [low-current] detector circuit may provide a better solution for detecting low-level signals (e.g. voltage signals) than circuits typically used in performing that function in the MOST environment. For example, present day detector circuits using a diode, filter, and comparator, typically have problems rejecting common mode signals, and use much more current than the various embodiments of the low-current detector circuit described herein.

In one set of embodiments, a low-current detector (or detector circuit) may comprise a translinear buffer that is driven at the buffer input and at the buffer output by a differential input signal, e.g. MOST ePHY signals. The differential input signal may be half-wave rectified through the buffer output devices and may be filtered to provide the detected output. When applying a common mode signal, the buffer's input and output may track each other, and no current may be rectified in the output devices, thus providing excellent common mode rejection.

In one embodiment, a low-current circuit is configured to detect activity on a twisted wire bus, which may be functioning as MOST ePHY lines. The circuit may detect a signal having a specified bit rate (e.g. 50 Mbps), and may reject common-mode signals from 100 MHz to 400 MHz up to a specified peak-to-peak voltage, for example up to 1V peak-to-peak. In one embodiment, the circuit may comprise a pair of NMOS devices and a pair of PMOS devices configured to form a translinear loop. A first node of the circuit may be configured to reside at a voltage level between a supply voltage, for example 3.3V, and a reference voltage, for example reference ground. In one set of embodiments, the first node may be configured to reside at a voltage level midway between the supply voltage and reference ground.

The circuit may be configured to obtain a series of additional desired voltage levels as follows. A voltage developed at a second node may be equivalent to the sum of the voltage developed at the first node and a gate-source voltage developed in the first PMOS device. A voltage developed at a third node may be equivalent to a difference of the voltage developed at the second node and a gate-source voltage developed in the first NMOS device. A voltage developed at a fourth node may be equivalent to a difference of the voltage developed at the third node and a gate-source voltage developed in the second PMOS device. The circuit may further be configured such that the voltage developed at the first node may also be equivalent to a sum of the voltage developed at the fourth node and a gate-source voltage developed in the second NMOS device. This may result in a sum of the gate-source voltage developed in the first PMOS device and the gate-source voltage developed in the second NMOS device being equivalent to a sum of the gate-source voltage developed in the first NMOS device and the gate-source voltage developed in the second PMOS device.

In one set of embodiments, a first current may be applied to the source terminal of the first PMOS device, which may be configured at the second node, and a second current may be applied to the source terminal of the second NMOS device, which may be configured at the fourth node. Therefore, when the channel-width and channel-length of all four MOS devices are the same, and the first current is equivalent to the second current, the currents developed in the first NMOS device and the second PMOS device will also be equivalent to the first current. Thus, a translinear buffer may be obtained with the buffer-input configured at the first node and the low impedance buffer-output configured at the third node.

The two inputs from the differential input, e.g. from a MOST ePHY bus, may be respectively applied at a first input node coupling to the first node, which may also couple together the respective gate terminals of the first PMOS device and the second NMOS device, and a second input node coupling to the third node, which may also couple together the respective source terminals of the first NMOS device and the second PMOS device. When a common-mode signal is present on these inputs, the current developed in the second PMOS device and in the first NMOS device may remain constant, because any changes in the voltage developed at the first node may be tracked identically at the third node. In other words, the voltage developed at the third node may change identically to the voltage developed at the first node. Therefore, the respective voltages developed at the respective drain terminals of the first NMOS device and the second PMOS device may remain unchanged.

In one embodiment, these voltages may be determined by a first resistor coupled between the drain terminal of the first NMOS device and a supply voltage, and a second resistor coupled between the drain terminal of the second PMOS device and the reference voltage (e.g. reference ground). More specifically, the voltage drop (from the supply voltage) across the first resistor may determine the value of the voltage developed at the gate terminal of the first NMOS device, and the voltage drop (to the reference voltage) across the second resistor may determine the voltage developed at the gate terminal of the second PMOS device. When the current flowing in both the first NMOS device and the second PMOS device, and thus in the first resistor and the second resistor, has a value equivalent to the first current, the voltage drop across each resistor will also be equivalent to the first current multiplied by the respective value of the resistor. In addition, a first capacitance may be coupled across the terminals of the first resistor, and a second capacitance may be coupled across the terminals of the second resistor, to form respective resistive/capacitive loads that may act as filters.

When a differential input signal is applied to the first input and the second input of the detector circuit, the first NMOS device and the second PMOS device may both receive a spike of current flowing through their respective drain terminals to their respective resistive/capacitive loads. The current spikes may only flow in one direction, therefore, when filtered, they may produce a respective DC voltage at the drain terminal of the first NMOS device, and a respective DC voltage at the second PMOS device, where the two DC voltages have the same value, which is proportional to the size of the differential input voltage. The common mode input may therefore be rejected at the respective drain terminals of the first NMOS device and the second PMOS device, and a differential signal may be rectified to produce an increase in voltage at the same respective drain terminals.

In alternate embodiments, a detector circuit may have a differential input comprising a first input and a second input, and may have an output configured to provide an output signal of the detector, the output signal being indicative of differential signal activity on the differential input. The detector circuit may include a first buffer having an input coupled to the first input of the detector, and a second buffer having an input coupled to the second input of the detector. The first buffer may include output devices configured to provide an output of the first buffer, and the second buffer may include output devices configured to provide an output of the second buffer, with the output of the first buffer and the output of the second buffer coupled to a common (first) node. The detector circuit may further include a load circuit, with the output devices of the first buffer and the output devices of the second buffer configured to fully rectify a differential signal present at the differential input of the detector circuit, to generate a fully rectified first signal, and the load circuit filtering the fully rectified first signal to provide the output signal of the detector circuit, thereby indicating whether there is differential signal activity at the differential input of the detector circuit.

BRIEF DESCRIPTION OF THE DRAWINGS

The foregoing, as well as other objects, features, and advantages of this invention may be more completely understood by reference to the following detailed description when read together with the accompanying drawings in which:

FIG. 2 shows another embodiment of a low-current detector circuit that rejects large common mode signals on differential input lines, and still detects smaller differential signals;

FIG. 3 shows one embodiment of a calibration circuit that may be used with the low-current detector circuit of FIG. 2, allowing for calibration of the low-current detector circuit;

FIG. 4 shows one embodiment of a detector circuit having calibration capability, configured with the low-current detector of FIG. 2 and the calibration circuit of FIG. 3.

Figure 1:
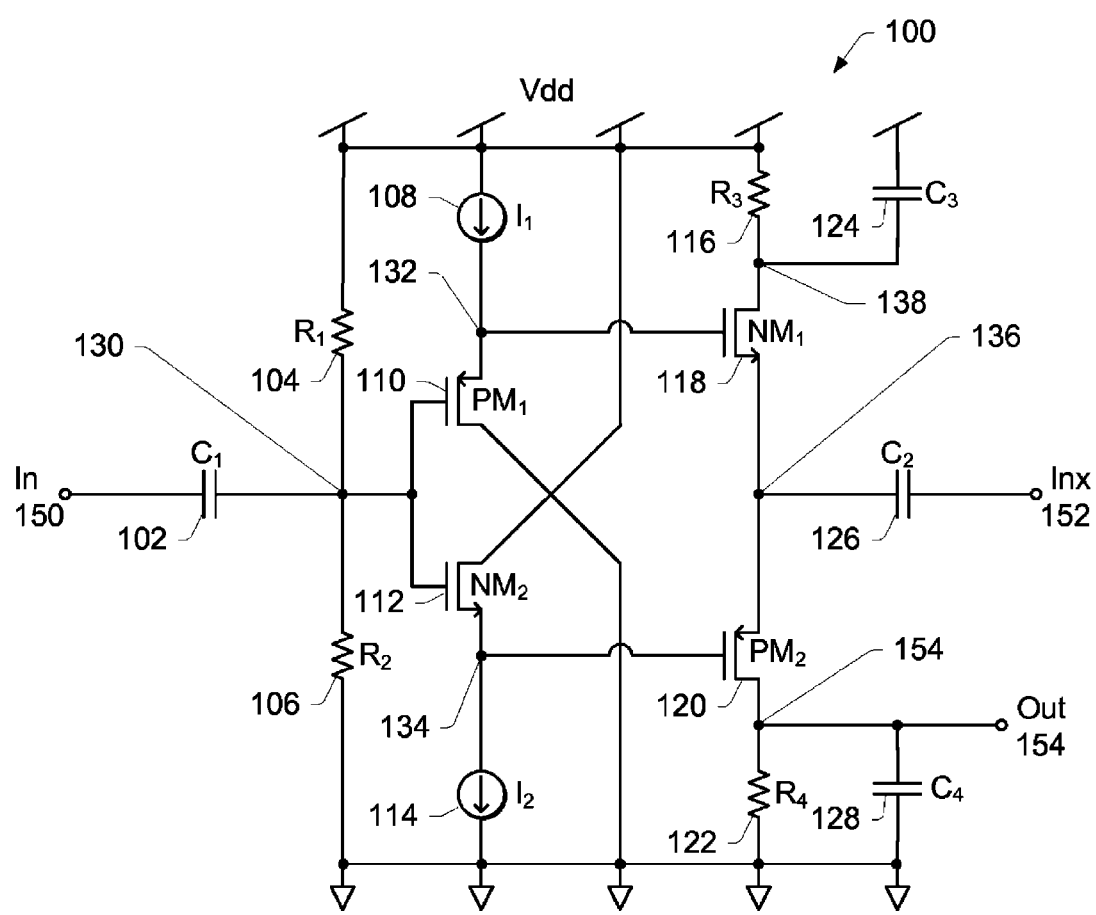
FIG. 1 shows one embodiment of a low-current detector circuit that rejects large common mode signals on differential input lines, and still detects smaller differential signals.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must)." The term "include", and derivations thereof, mean "including, but not limited to". The term "connected" means "directly or indirectly connected", and the term "coupled" means "directly or indirectly connected".

DETAILED DESCRIPTION OF THE PREFERRED EMBODIMENTS

As used herein, "structure type" refers to the physical structure of an individual resistive element, or resistor implemented on an integrated circuit for a given process. For example, for a given CMOS process a resistor may be implemented to be of one of a variety of structure types, which may include n-diffusion, p-diffusion, n-well, p-well, pinched n-well, pinched p-well, poly-silicon and metal. When configured on an integrated circuit, a single "resistance" may be constructed as a single resistor or as two or more resistors connected together, where each individual resistor may be of a different structure type. When constructed of more than one resistor, the nominal value of the resistance may be equivalent to the sum of the nominal values of the resistors that make up the resistance. A "resistor string" refers to resistances connected in series, with connective taps available at the terminals of the resistances. Similarly, a "capacitance" may be constructed as a single capacitor or as two or more capacitors connected together. When constructed of more than one capacitor, the nominal value of the capacitance may be equal to the sum of the nominal values of the capacitors that make up the capacitance.

Furthermore, as used herein, the term "translinear loop" refers to a circuit comprising nonlinear devices, such as devices having a nonlinear voltage-to-current relationship (e.g. transistor devices), with the nonlinear devices configured to form a circuit having an input and an output such that an input current flowing in the input and an output current flowing in the output have a linear relationship with respect to each other. In other words, a translinear loop may comprise nonlinear devices arranged in a structure such that the output current of the structure may be linearly controlled using an input current, with a linear transfer function relating the output current of the structure to the input current of the structure. The translinear loop may therefore be considered a linear current-mode circuit comprising devices that individually exhibit nonlinear voltage-to-current characteristics (e.g. CMOS transistor devices).

FIG. 1 shows one embodiment of a low-current detector circuit 100 operable to reject large common mode signals on differential input lines 150 and 152, while still detecting smaller differential signals applied to the same set of differential input lines. Being thus configured, circuit 100 may be operated to detect activity on a twisted wire bus, for example to detect activity on the ePHY (Electrical Physical Layer) lines of a MOST network, to wake up that MOST network. Circuit 100 may be configured to detect a signal having a specified bit rate (e.g. 50 Mbps), and may reject common-mode signals from a first specified frequency (e.g. 100 MHz) to a second specified frequency (e.g. 400 MHz), up to a specified peak-to-peak voltage, (e.g. 1V peak-to-peak).

In one embodiment the circuit may comprise a first transistor, e.g. PMOS device 110, a second transistor, e.g. NMOS device 112, a third transistor, e.g. NMOS device 118, and a fourth transistor, e.g. PMOS device 120, configured to form a translinear loop as shown in FIG. 1. A first node 130 of circuit 100 may be configured to reside at a voltage level between supply voltage Vdd (e.g. 3.3V) and a reference voltage signal (e.g. reference ground). In the embodiment shown in FIG. 1, the respective values of a first resistor 104 and a second resistor 106 may be specified to develop the desired voltage at node 130, which may be set to reside at approximately mid-way between the supply voltage Vdd and reference ground. The differential input signals to circuit 100 may be applied at input nodes 150 and 152, which may be coupled to node 130 and 136, respectively, via respective capacitors 102 and 126. NMOS device 118 and PMOS device 120 may each have a respective load circuit applied at their respective drain terminal. For example, resistor 116 coupled in parallel with capacitor 124 may be the load circuit between Vdd and the drain terminal of NMOS device 118, and resistor 122 coupled in parallel with capacitor 128 may be the load circuit between the drain terminal of PMOS device 120 and reference ground. In one set of embodiments, the output 154 of circuit 100 may be configured at the drain terminal of PMOS device 120. In alternate embodiments, the output 154 of circuit 100 may equally be configured at the drain terminal of NMOS device 138, if so desired, since the drain terminal of NMOS device 118 (coupling to a load circuit that may comprise resistor 116 and capacitor 124) may also indicate the presence of a differential input signal at inputs In 150 and Inx 152.

Circuit 100 may be configured to obtain a series of desired voltage levels as follows. A voltage developed at a second node 132 may be equivalent to the sum of the voltage developed at first node 130 and the gate-source voltage ($V_{GS}$) developed in first PMOS device 110. A voltage developed at a third node 136 may be equivalent to a difference of the voltage developed at second node 132 and the $V_{GS}$ developed in first NMOS device 118. A voltage developed at a fourth node 134 may be equivalent to a difference of the voltage developed at third node 136 and the $V_{GS}$ developed in second PMOS device 120. Circuit 100 may further be configured such that the voltage developed at first node 130 may also be equivalent to a sum of the voltage developed at fourth node 134 and the $V_{GS}$ developed in second NMOS device 112. This may result in a sum of the $V_{GS}$ developed in first PMOS device 110 and the $V_{GS}$ developed in second NMOS device 112 being equivalent to a sum of the $V_{GS}$ developed in first NMOS device 118 and the $V_{GS}$ developed in second PMOS device 120.

A first current source 108 may be configured to apply a first current $I_1$ to the source terminal of first PMOS device 110, and a second current source 114 may be configured to apply a second current $I_2$ to the source terminal of second NMOS device 112. Therefore, when the channel-width (W) and channel-length (L) of all four MOS devices (i.e. devices 110, 118, 120, and 112) are the same, and $I_1$ is equivalent to $I_2$, the magnitude of the current developed in first NMOS device 118, and the magnitude of the current developed in second PMOS device 120 will both be equivalent to $I_1$. Thus, a translinear buffer may be obtained with the buffer-input configured at first node 130, and a low impedance buffer-output configured at third node 136. When a common-mode signal is present on input terminals 150 and 152, the current developed in second PMOS device 120 and in first NMOS device 118 may remain constant, as changes in the voltage developed at first node 130 may be tracked identically at third node 136. In other words, the voltage developed at third node 136 may change identically to the voltage developed at first node 130. Therefore, the respective voltages developed at the respective drain terminals of first NMOS device 118 and second PMOS device 120 may remain unchanged.

The voltage relationships for the embodiment shown in FIG. 1 may therefore be summarized by the following voltage equations:

$$V_{132} = V_{130} + V_{GS110} \qquad (1)$$

$$V_{136} = V_{132} - V_{GS118} = V_{130} + V_{GS110} - V_{GS118} \qquad (2)$$

$$V_{134}=V_{136}-V_{GS120}=V_{130}+V_{GS110}-V_{GS118}-V_{GS120} \quad (3)$$

$$V_{130}=V_{134}+V_{GS112}, \quad (4)$$

From which it follows that:

$$V_{GS110}+V_{GS112}=V_{GS118}+V_{GS120}. \quad (5)$$

Where $V_x$ represents the voltage developed at node 'x' (for example, $V_{130}$ represents the voltage developed at node 130), and $V_{GSx}$ represents the gate-source voltage developed in MOS device 'x' (for example, $V_{GS110}$ represents the gate-source voltage developed in PMOS device 110).

The inputs from the twisted-pair wires, such as the ePHY inputs for a MOST network, may be configured as differential inputs In 150 and Inx 152, with In 150 coupled to the input 130 of the translinear buffer via capacitor 102, and Inx 152 coupled to the output 136 of the translinear buffer via capacitor 126. As previously mentioned, when a common-mode signal is applied to inputs In 150 and Inx 152, the current developed in NMOS device 118 and PMOS device 120 may remain constant because as $V_{130}$ changes, $V_{136}$ may change identically. The respective voltages developed at nodes 138 and 154 (where node 154 also represents the output of current detector circuit 100) may remain unchanged, at a voltage of $$V_{138}=Vdd-I_{108}*R_3, \text{ and} \quad (6)$$

$$V_{154}=I_{108}*R_4, \quad (7)$$

where $I_{108}$ represents the value of current 108 (i.e. $I_1$), and $R_3$ and $R_4$ represent resistors 116 and 122, respectively.

Thus, when a differential signal is applied at inputs In 150 and Inx 152, NMOS device 118 and PMOS device 120 may both receive a spike of current flowing through their drain terminals to their respective drain resistive/capacitive load circuits (comprising resistor 116 and capacitor 124, and resistor 122 and capacitor 128, respectively). The current spikes may only flow in one direction, however, thus, when filtered they may produce a DC voltage $V_{138}$ at node 138 and a DC voltage $V_{154}$ at node 154, which may each be proportional to the size of the differential input voltage. This may operate to reject the common mode input at nodes 138 and 154, while also rectifying the differential signal to produce an increase in voltage at nodes 138 and 154. Thus, circuit 100 may operate to detect a small differential input applied between inputs In 150 and Inx 152, while simultaneously rejecting common-mode signals, with the detection signal provided at node 154.

Due to the asymmetric structure of detector circuit 100, the impedance at input In 150 and the impedance at input Inx 152 may differ from each other. In some cases this may lead to detector circuit 100 potentially introducing errors during data transmissions, depending on the actual difference between the two input impedances. A more symmetric structure, however, may be designed to prevent potential data transmission errors that may arise from a difference in the respective input impedances seen at the differential inputs. FIG. 2 shows an alternative embodiment of a low-current activity detector designed according to principles of the present invention. Instead of the single-buffer approach presented in the embodiment shown in FIG. 1, detector circuit 200 may be implemented using two buffers for a more symmetrical structure. Therefore, detector circuit 200 may be configured to have matching impedances at its respective differential inputs.

As shown in FIG. 2, detector circuit 200 may be configured with a first buffer that may comprise transistor devices 204, 206, 208, and 210, and a second buffer that may comprise transistor devices 216, 218, 220, and 222. The differential inputs In 250 and Inx 252 of detector circuit 200 may respectively be coupled to input 238 of the first buffer via capacitor 202, and input 246 of the second buffer via capacitor 203. The respective outputs of the two buffers may be tied together, forming node 242 as shown. In one set of embodiments, the respective drain terminals of transistors 210 and 218 may be coupled together to form the output Out 254 of detector circuit 200, with a resistive/capacitive load circuit, comprising resistor 228 and capacitor 230, coupled between output node 254 and a first voltage reference, e.g. reference ground. In alternate embodiments, output Out 254 of detector circuit 200 may be formed by coupling together the respective drain terminals of transistors 208 and 216, with a resistive/capacitive load circuit, similar to the one comprising resistor 228 and capacitor 230, coupled between output node 254 and a supply voltage, e.g. supply voltage Vdd.

The load circuit may operate as a smoothing filter, as will further be explained below. A first resistor 234 may be coupled between a specified second reference voltage $V_{ref}$ and node 238, to establish a voltage having a value of $V_{ref}$ at node 238. Similarly, a second resistor 232 may be coupled between reference voltage $V_{ref}$ and node 246, to establish a voltage having a value of $V_{ref}$ at node 246. In one set of embodiments, $V_{ref}$ may be specified to have a value that is half the value of Vdd. Finally, current sources 212, 214, 224, and 226 may be configured to supply respective currents to the respective drain terminals of transistor devices 204, 206, 220, and 222 as shown. Detector circuit 200 may also be configured with switches $SW_1$-$SW_6$ to allow calibration of detector circuit 200, as will also further be explained below. For normal operation of detector circuit 200, switches $SW_1$-$SW_6$ will be assumed to be in the positions as shown in FIG. 2.

Detector circuit 200 may operate according to principles similar to the operation of detector circuit 100. As previously mentioned, differential inputs In 250 and Inx 252, which may represent MOST ePHY bus lines, for example, may be coupled to nodes 238 and 256, which may correspond to the respective inputs of two buffers, as also previously described.

Common-Mode Signal Operation

The following describes the operation of detector circuit 200 when a common-mode signal (e.g. a common-mode voltage signal) is applied at inputs In 250 and Inx 252, that is, when the signal at each input (and hence the voltage at each input) has the same value at any point in time. However, for the sake of simplicity, due to the symmetrical structure of detector circuit 200 it is sufficient to describe the operation of one side of detector circuit 200, in this case the side driven by In 250. Consequently, the side of detector circuit driven by Inx 252 may operate in a similar manner, leading to the overall operation of detector circuit 200. Therefore, the following component pairs (one from each side of circuit 200) may be considered to correspond to each other: NMOS devices 204 and 220, NMOS devices 208 and 216, PMOS devices 206 and 222, PMOS devices 210 and 218, current sources 212 and 224, current sources 214 and 226, and resistors 234 and 232. Those skilled in the art will therefore appreciate that the operation of any of those components comprised in one side of detector circuit 200 may be the same as the operation of the corresponding components comprised in the other side of detector circuit 200.

In one set of embodiments, a first current $I_1$ may be provided by current source 212 to NMOS device 204, and a second current $I_2$, equivalent in value to first current $I_1$, may be provided by current source 214 to PMOS device 206. With a voltage level of $V_{ref}$ established at nodes 238 and 246, no current will flow through resistor 234 and resistor 232. NMOS transistors 204 and 208 may be configured to have identical channel-width to channel-length ratios (W/L), and PMOS transistors 206 and 210 may also be configured to have identical channel-width to channel-length ratios. As a result, when $I_1$ is of the same magnitude as $I_2$, the current flowing in NMOS device 204 and PMOS device 206, and NMOS device 208 and PMOS device 210 may be of the same magnitude, in this case $I_1$. Accordingly, the voltage developed at node 240 ($V_{240}$) may be equivalent to a sum of $V_{ref}$ and $V_{GS204}$, (which is the gate-source voltage developed in NMOS device 204), as a result of the gate and drain terminals of NMOS device 204 being tied together, and the voltage developed at node 242 ($V_{242}$) may have a value equivalent to the difference between $V_{240}$ and $V_{GS208}$, (which is the gate-source voltage developed in NMOS device 208). In other words, the voltage developed at node 242 ($V_{242}$) may be equivalent to $V_{ref}$.

As mentioned above, due to the symmetrical structure of detector circuit 200, the same analysis may be applied to the side of the circuit driven by Inx 252, which may lead to maintaining $V_{ref}$ at node 242, through the same magnitude current flowing through NMOS devices 216 and 220, and PMOS devices 218 and 222, which in this case may be $I_3$, if $I_4$ is a current of same magnitude as $I_3$. Because the sources of transistor devices 208, 216, 210, and 218 are tied together, no differential current may develop in detector circuit 200, and the respective currents from PMOS device 210 and PMOS device 218 may add up to a DC current (in this case $I_1+I_3$) flowing through resistor 228 to reference ground, leaving the voltage at output node 254 unchanged. Detector circuit 200 may therefore operate to reject a common-mode signal.

Differential Signal Operation

The following describes the operation of detector circuit 200 when a differential signal is applied to In 250 and Inx 252. In other words, the signal (e.g. a voltage signal) applied at In 250 may be of different magnitude than the signal applied at Inx 252. In this example, the signal at In 250 is assumed to be higher than the signal at Inx 252. When the signal level at In 250 rises higher than the signal level at Inx 252, the voltage at the gate terminal of NMOS device 208 (i.e. node 240) and the voltage at the gate terminal of PMOS device 210 may both rise, while the voltage level at the gate terminal of NMOS device 216 (i.e. node 244) and the voltage level at the gate terminal of PMOS device 218 may both decrease. This may lead to an increased current in NMOS device 208 and a decreased current in PMOS device 210, and a decreased current in NMOS device 216 and an increased current in PMOS device 218, further resulting in current flowing from NMOS device 208 to PMOS device 218, and into resistor 228 through node 254. The current increase in NMOS device 208 and PMOS device 218 may be higher than the current decrease in NMOS device 216 and PMOS device 210, resulting in the voltage at Out 254 changing according to the level of the differential input signal (i.e., the differential input signal level). The resistive/capacitive load comprising resistor 228 and capacitor 230 may operate to filter the changing output signal at Out 254 to provide a constant DC voltage during detection of differential signal activity at In 250 and Inx 252.

As previously mentioned, due to its symmetrical structure, detector circuit 200 may operate in a manner similar to what has been described above, when the differential signal leads to the voltage at Inx 252 rising above the voltage at In 250. When the signal level at Inx 252 rises higher than the signal level at In 250, the voltage at the gate terminal of NMOS device 216 (i.e. node 244) and the voltage at the gate terminal of PMOS device 218 may both rise, while the voltage level at the gate terminal of NMOS device 208 (i.e. node 240) and the voltage level at the gate terminal of PMOS device 210 may both decrease. This may lead to an increased current in NMOS device 216 and a decreased current in PMOS device 218, and a decreased current in NMOS device 208 and an increased current in PMOS device 210, further resulting in current flowing from NMOS device 216 to PMOS device 210, and into resistor 228 through node 254. The current increase in NMOS device 216 and PMOS device 210 may be higher than the current decrease in NMOS device 208 and PMOS device 218, resulting in the voltage at Out 254 changing according to the differential input signal.

Thus, detector circuit 200 may be operated to fully rectify a differential input signal using two buffers, and provide a detection signal indicative of differential signal activity at the inputs of the detection circuit, while rejecting common-mode signals (i.e. not producing a detection signal when a common-mode signal is applied to the differential inputs). Contrasted with detector circuit 100 from FIG. 1, detector circuit 200 may produce a higher output voltage swing for the same differential signal, and may be free of error during data transmissions as a result of matching impedances at the differential inputs In 250 and Inx 252. It should be noted however, that while the structure of detector circuit 200 has been characterized as being symmetrical and comprising matching transistor devices and current sources, it may be difficult to achieve perfectly matching components during fabrication. As a result, the output voltage at Out 254 may not remain completely unchanged when a common-mode signal is applied at inputs In 250 and Inx 252. This may result in Out 254 indicating differential activity at inputs In 250 and Inx 252 even when no differential signal to those inputs has been applied.

One possible solution to correct for any component mismatches that may be present from the fabrication process is to calibrate detector circuit 200 before use. FIG. 3 shows a calibration circuit 300 that may be used in conjunction with switches $SW_1$-$SW_6$ of detector circuit 200 to calibrate detector circuit 200. In one set of embodiments, the output of detector circuit 200 may be coupled to the input of calibration circuit 300 (as shown in FIG. 3) to obtain detection circuit 400 shown in FIG. 4. Therefore, detection circuit 400 may now include detection circuit 200 and calibration circuit 300, and the output of calibration circuit 300 may become the actual Detector Output of detection circuit 400. In this manner, each detector circuit may be manufactured, configured in a system, and calibrated before use each time the system is powered up, or periodically calibrated as needed during regular operation, adapting to present system conditions to provide precise operation regardless of those system conditions.

Calibration of the detector circuit may be performed as follows. Once the system in which detector circuit 400 is configured has been powered up, the polarity of switches $SW_1$-$SW_6$ in detector circuit 200 may be changed from the positions shown in FIG. 2. Thus, switches $SW_1$, $SW_2$, $SW_4$, and $SW_5$ may be opened, and switches $SW_3$ and $SW_6$ may be closed, to prevent any signals at inputs In 250 and Inx 252 from coupling into nodes 238 and 246 respectively. In other words, by changing the polarity of the switches as described above, any common-mode input signal or differential input signal that may be present at In 250 and Inx 252 is decoupled from nodes 238 and 246, respectively. This may force node 238 and node 246 to each reside at a voltage level equivalent to $V_{ref}$. When components within detector circuit 200 are not matched (for example, NMOS device 204 doesn't have the same W/L as NMOS device 208, current sources 212 and 214 are not providing exactly the same current, etc.), voltage levels at the gates of transistor devices 208, 210, 216, and 218 may not be the same, and a current may flow across node 242 from one buffer into the other, as per the differential signal operation of detector circuit 200 described above, except in this case the voltage change at the gate of any of the affected transistor devices may not be due to a voltage difference between In 250 and Inx 252, but due to an asymmetry introduced into the structure of detector circuit 200 by mismatched components. This may result in a voltage change at Out 254, even though nominally a common-mode signal is being applied at nodes 238 and 246.

Subsequently, changing the polarity of the switches in calibration circuit 300 from the positions shown in FIG. 3, i.e. closing switches $SW_7$ and $SW_8$, and opening switch $SW_9$, capacitor 304 may be charged to the voltage developed at Out 254. Alternatively, the polarity of the switches in calibration circuit 300 may be changed from the positions shown in FIG. 3 before, or simultaneously with changing the polarity of the switches in detector circuit 200, to obtain the same result. Once capacitor 304 has been charged to the voltage level present at Out 254, switches $SW_7$ and $SW_8$ may be opened again, then switch $SW_9$ may be closed, resulting in the voltage appearing at Out 254 being stored on capacitor 304. The switches in detector circuit 200 may then be changed back to the positions shown in FIG. 2, and detector circuit 400 may begin normal operation. The voltage stored at capacitor 304 represents the "quiescent voltage" that may be developed at the output Out 254 as a result of a quiescent current flowing into R3 when no input signal is present at inputs In 250 and Inx 252. The quiescent voltage may additionally be affected by components inside detector circuit 200 not being perfectly matched. By subtracting the quiescent voltage from the output of detector 200 during normal operation, errors may be eliminated from the detection signal. As shown in FIG. 3, during normal operation, the quiescent voltage stored on capacitor 304 may be subtracted from the output of detector circuit 200 using circuit 302, and the output of circuit 302 may then be used at the output of detector circuit 400 to indicate differential signal activity on input lines In 250 and Inx 252.

In one set of embodiments, the sensitivity of detector circuit 400 may also be specified by adding a built-in offset, or threshold voltage in circuit 302, which may determine the minimum level of differential signal, or voltage, that may be detected by detection circuit 400 as signal activity on signal lines coupled to In 250 and Inx 252. For example, circuit 302 may be configured to begin toggling its Detector Output only when the signal level at Out 254 rises above a sum voltage equivalent of the quiescent voltage stored on capacitor 304, added to the specified threshold voltage. For example, the threshold voltage may be set to 100 mV, which may result in detector circuit 400 not detecting a differential signal that is lower than 100 mV, to allow for a certain amount of noise on the differential signal lines that are coupled to In 250 and Inx 254, and not detecting such noise as valid signal activity on those signal lines.

Figure 5:
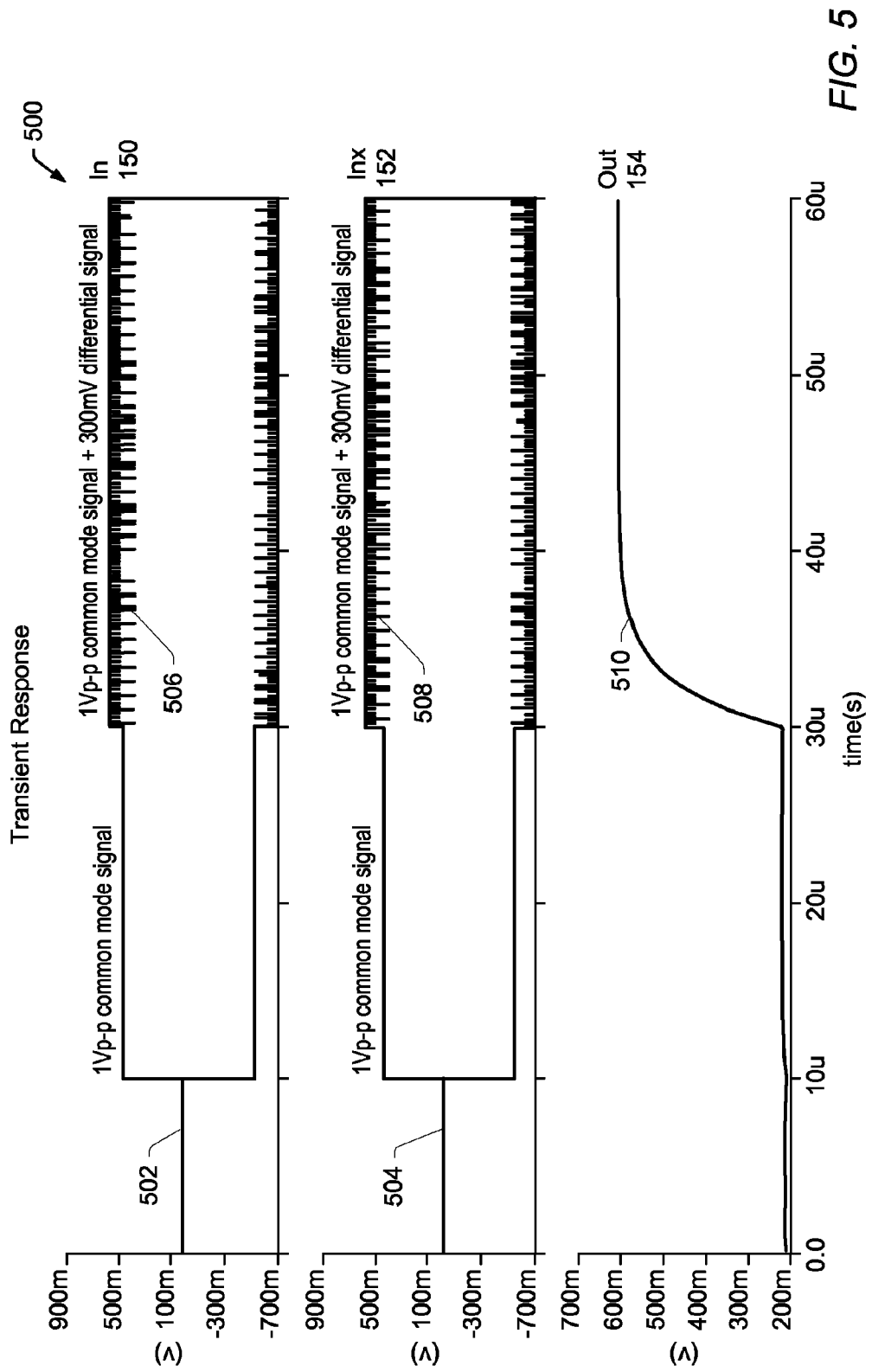
FIG. 5 shows the voltage waveforms of one set of input signals, and the voltage waveform of a resulting output when the input signals are applied to the differential inputs of one embodiment of a low-current detector circuit designed in accordance with principles of the present invention.

FIG. 5 shows the voltage waveforms of one set of input signals 502 and 504, and the voltage waveform 510 of a resulting output when the input signals are applied to low-current detector circuit 100 shown in FIG. 1, to provide an example of the operation of at least one embodiment of a low-current detector circuit designed in accordance with principles of the present invention. As indicated by the output waveform 510 in FIG. 5, when a common-mode signal 502 (in this case a 1 V peak-to-peak common-mode voltage) is applied to input In 150 of detector circuit 100, and an identical common-mode signal 504 is applied to input Inx 152 of detector circuit 100, the output Out 154 of detector circuit 100 may show no considerable change in its voltage level, thereby rejecting the common-mode signal. Once a differential signal is added to the common-mode signals as shown in voltage waveforms 506 and 508, the output of detector circuit rises and remains at a steady level while differential signal activity is present on inputs In 150 and Inx 152, thereby indicating the presence of the differential signal activity.

Although the embodiments above have been described in considerable detail, other versions are possible. Numerous variations and modifications will become apparent to those skilled in the art once the above disclosure is fully appreciated. It is intended that the following claims be interpreted to embrace all such variations and modifications. Note the section headings used herein are for organizational purposes only and are not meant to limit the description provided herein or the claims attached hereto.

I claim:

1. A detection circuit comprising:
   a differential input comprising a first input and a second input;
   an output configured to provide a first output signal of the detection circuit, wherein the first output signal is indicative of differential signal activity on the differential input;
   a first buffer having an input coupled to the first input of the detection circuit, and comprising an output stage configured to provide an output of the first buffer; and
   a second buffer having an input coupled to the second input of the detection circuit, and comprising an output stage configured to provide an output of the second buffer; and
   a load circuit;
   wherein the output of the first buffer and the output of the second buffer are coupled to a first node;
   wherein the output stage of the first buffer and the output stage of the second buffer are configured to fully rectify a differential input signal present at the differential input, to generate a fully rectified first signal; and
   wherein the load circuit is configured to filter the fully rectified first signal to generate the first output signal of the detector.

2. The detection circuit of claim 1, wherein the first buffer and the second buffer each comprise a respective input stage, wherein the input stage of the first buffer comprises a first pair of transistors, each of the first pair of transistors having a respective first channel terminal coupled to a second node configured as the input of the first buffer, and wherein the input stage of the second buffer comprises a second pair of transistors, each of the second pair of transistors having a respective first channel terminal coupled to a third node configured as the input of the second buffer; and
   wherein the output stage of the first buffer comprises a third pair of transistors, each of the third pair of transistors having a respective first channel terminal coupled to the first node, and wherein the output stage of the second buffer comprises a fourth pair of transistors, each of the fourth pair of transistors having a respective first channel terminal coupled to the first node.

3. The detection circuit of claim 2, wherein the second node and the third node are each coupled to a reference voltage.

4. The detection circuit of claim 2, further comprising one of:
   a first load circuit coupled between a fourth node and a reference voltage that is lower than a supply voltage powering the detection circuit, wherein the fourth node is coupled to respective second channel terminals of a first one of the third pair of transistors and a first one of the fourth pair of transistors, wherein the fourth node is configured as the first output of the detection circuit; or
   a second load circuit coupled between a fifth node and the supply voltage powering the detection circuit, wherein the fifth node is coupled to respective second channel terminals of a second one of the third pair of transistors and a second one of the fourth pair of transistors, wherein the fifth node is configured as the first output of the detection circuit.

5. The detection circuit of claim 1, further comprising:

a calibration circuit configured to store a quiescent voltage developed at the first output of the detection circuit when no input signal is driving the first input of the detection circuit and the second input of the detection circuit;

wherein the calibration circuit is further configured to subtract the quiescent voltage from the first output signal to generate a second output signal of the detector circuit when the differential input signal is present at the differential input.

6. The detection circuit of claim 5, wherein the calibration circuit is configured to further subtract a specified threshold voltage from the first output signal to generate the second output signal of the detector circuit when the differential input signal is present at the differential input.

* * * * *